(12) United States Patent
Yamazaki et al.

(10) Patent No.: US 10,479,910 B2
(45) Date of Patent: Nov. 19, 2019

(54) PRIMER COMPOSITION, ADHERING METHOD, AND ELECTRIC/ELECTRONIC PART

(71) Applicant: Dow Corning Toray Co., Ltd., Tokyo (JP)

(72) Inventors: Ryosuke Yamazaki, Chiba (JP); Hiroaki Yoshida, Chiba (JP); Shin Yoshida, Chiba (JP)

(73) Assignee: Dow Toray Co., Ltd., Tokyo (JP)

( * ) Notice: Subject to any disclaimer, the term of this patent is extended or adjusted under 35 U.S.C. 154(b) by 81 days.

(21) Appl. No.: 15/553,407

(22) PCT Filed: Feb. 23, 2016

(86) PCT No.: PCT/JP2016/000960
§ 371 (c)(1),
(2) Date: Aug. 24, 2017

(87) PCT Pub. No.: WO2016/136244
PCT Pub. Date: Sep. 1, 2016

(65) Prior Publication Data
US 2018/0105720 A1    Apr. 19, 2018

(30) Foreign Application Priority Data

Feb. 26, 2015 (JP) ................. 2015-037452

(51) Int. Cl.
C08L 83/10 (2006.01)
C09D 183/10 (2006.01)
C09D 5/00 (2006.01)
C09D 7/40 (2018.01)

(52) U.S. Cl.
CPC ............ *C09D 183/10* (2013.01); *C08L 83/10* (2013.01); *C09D 5/00* (2013.01); *C09D 5/002* (2013.01); *C09D 7/40* (2018.01); *C08L 2203/20* (2013.01); *H01L 2224/16225* (2013.01); *H01L 2224/73265* (2013.01); *H01L 2924/181* (2013.01)

(58) Field of Classification Search
CPC ............... C08L 83/10; H01L 2924/181; H01L 2223/16225; H01L 2223/73265
USPC ...................................................... 428/447
See application file for complete search history.

(56) References Cited

U.S. PATENT DOCUMENTS 3,629,228 A * 12/1971 Hartlein et al. ....... C08G 77/44
528/17
8,865,830 B2 10/2014 Horstman et al.
2003/0236347 A1 12/2003 Furuya et al.
2006/0205237 A1 9/2006 Kodama et al.
2013/0245187 A1* 9/2013 Swier .................... C08G 77/14
524/500
2014/0031465 A1 1/2014 Horstman et al.

FOREIGN PATENT DOCUMENTS

| EP | 0827993 A2 | 3/1998 |
|---|---|---|
| JP | 2004075970 A | 3/2004 |
| JP | 2004339450 A | 12/2004 |
| JP | 2006253398 A | 9/2006 |
| JP | 2007246803 A | 9/2007 |
| JP | 2014510802 A | 5/2014 |
| WO | WO2013090691 A1 | 6/2013 |
| WO | WO2013142240 A1 | 9/2013 |
| WO | WO2014129347 A1 | 8/2014 |
| WO | WO2014150841 A2 | 9/2014 |
| WO | WO2014152522 A2 | 9/2014 |

OTHER PUBLICATIONS

PCT/JP2016/000960 International Search Report dated May 31, 2016, 2 pages.
English language abstract and machine translation for JP2004339450 (A) extracted from http://worldwide.espacenet.com database on Oct. 5, 2017, 26 pages.
English language abstract and machine translation for JP2007246803 (A) extracted from http://worldwide.espacenet.com database on Oct. 5, 2017, 20 pages.
English language abstract and machine translation for WO2014129347 (A) extracted from http://worldwide.espacenet.com database on Oct. 5, 2017, 24 pages.

* cited by examiner

*Primary Examiner* — Margaret G Moore

(74) *Attorney, Agent, or Firm* — Warner Norcross + Judd LLP

(57) ABSTRACT

A primer composition is provided. The primer composition comprises: (A) an organosiloxane block copolymer represented by the average unit formula: $(R^1{}_2SiO_{2/2})_a(R^2SiO_{3/2})_b$, wherein each $R^1$ and $R^2$ is independently an alkyl group having 1 to 12 carbon atoms, an aryl group having 6 to 20 carbon atoms, or an aralkyl group having 7 to 20 carbon atoms, "a" is a number in the range of 0.40 to 0.90, "b" is a number in the range of 0.10 to 0.60, and "a+b"=1.00, and having 0.5 to 35.0 mol % of silicon atom-bonded hydroxyl groups or silicon atom-bonded alkoxy groups, in which resinous siloxane blocks are connected by linear siloxane blocks; (B) a curing catalyst; and (C) an organic solvent. The primer composition improves the adhesion of silicone-cured products to base materials of optical semiconductor elements, package materials, substrates etc., and can suppress peeling or cracking caused by heat cycles.

12 Claims, 1 Drawing Sheet

PRIMER COMPOSITION, ADHERING METHOD, AND ELECTRIC/ELECTRONIC PART

CROSS-REFERENCE TO RELATED APPLICATIONS

This application is the National Stage of International Application No. PCT/JP2016/000960 filed on 23 Feb. 2016, which claims priority to and all advantages of JP Patent Application No. 2015-037452 filed on 26 Feb. 2015, the content of which is hereby incorporated by reference.

TECHNICAL FIELD

The present invention relates to a primer composition, an adhering method using said composition, and an electric/electronic part using said composition.

BACKGROUND ART

Regarding electric/electronic parts such as optical semiconductor apparatuses (LEDs), an optical semiconductor element is sealed with a silicone cured product in order to improve the reliability thereof. While a curable silicone composition in a hydrosilylation reaction is used in order to form this silicone cured product, the silicone cured product obtained by curing the composition has insufficient adhesion to base materials of optical semiconductor elements, package materials, substrates, etc. In particular, silicone cured products, which have less surface tackiness, less adhesion of dust, etc., and high hardness, have insufficient adhesion to base materials.

In order to improve the adhesion of silicone cured products to base materials, the base materials are known to be treated with a primer composition in advance. As this primer composition, for example, a primer composition (see Patent Document 1) comprising an acryl-based polymer, a silanol condensation catalyst, and a silane coupling agent; a primer composition (see Patent Document 2) comprising an organosiloxane oligomer having an epoxy group and a silicon atom-bonded alkoxy group, and an organic solvent; and a primer composition (see Patent Document 3) comprising a silane coupling agent, an organic aluminum compound of a Lewis acid, and an organic solvent are known.

Unfortunately, even these primer compositions problematically have insufficient adhesion. Further, due to miniaturization of LEDs, as well as increases in calorific values caused by high luminance of LEDs, in recent years, peeling or cracking problematically tends to occur between the silicone cured product and base materials, under heat cycles.

PRIOR ART DOCUMENTS

Patent Documents

Patent Document 1: Japanese Unexamined Patent Application Publication No. 2004-339450
Patent Document 2: Japanese Unexamined Patent Application Publication No. 2006-253398
Patent Document 3: Japanese Unexamined Patent Application Publication No. 2007-246803

SUMMARY OF INVENTION

Technical Problem

An object of the present invention is to provide a primer composition that improve the adhesion of silicone cured products to base materials of optical semiconductor elements, package materials, substrates, etc., and can suppress peeling or cracking of said silicone cured products caused by heat cycles. Moreover, another object of the present invention is to provide an adhering method that improves the adhesion of silicone cured products to base materials, and can suppress peeling or cracking of said silicone cured products caused by heat cycles. Further, another object of the present invention is to provide an electric/electronic part that improves the adhesion of silicone cured products to base materials, and can suppress peeling or cracking of said silicone cured products caused by heat cycles.

Solution to Problem

The primer composition of the present invention comprises:
(A) an organosiloxane block copolymer represented by the average unit formula:

$$(R^1{}_2SiO_{2/2})_a(R^2SiO_{3/2})_b$$

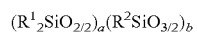

wherein each $R^1$ and $R^2$ is independently an alkyl group having a carbon number of 1 to 12, an aryl group having a carbon number of 6 to 20, or an aralkyl group having a carbon number of 7 to 20, "a" is a number in the range of 0.40 to 0.90, "b" is a number in the range of 0.10 to 0.60, and "a+b"=1.00,
and having 0.5 to 35.0 mol % of silicon atom-bonded hydroxyl groups or silicon atom-bonded alkoxy groups, in addition to being a solid at 25° C. and having a softening point of 200° C. or lower,
in which resinous siloxane blocks represented by the formula:

$$[R^2SiO_{3/2}]$$

wherein $R^2$ is the same as above,
are connected by linear siloxane blocks represented by the formula:

$$—(R^1{}_2SiO_{2/2})_n—$$

wherein $R^1$ is the same as above, and "n" is a number in the range of 10 to 400;
(B) a curing catalyst, in an amount to promote curing of this composition; and
(C) any amount of an organic solvent.

The adhering method of the present invention comprises: applying the abovementioned primer composition onto a base material; removing the organic solvent; and subsequently applying a curable silicone composition onto the obtained primer layer for curing.

The electric/electronic part of the present invention comprises an electric/electronic base material, a primer layer on the base material, and a silicone cured product on the primer layer, wherein the primer layer is formed by the abovementioned primer composition.

Advantageous Effects of Invention

The primer composition of the present invention improves the adhesion of silicone cured products to base materials of optical semiconductor elements, package materials, substrates, etc., and can suppress peeling or cracking of said silicone cured products caused by heat cycles. Moreover, the adhering method of the present invention improves the adhesion of silicone cured products to the base material, and can suppress peeling or cracking of said silicone cured products caused by heat cycles. Further, the electric/electronic part of the present invention improves the adhesion of silicone cured products to the base material, and can suppress peeling or cracking of said silicone cured products caused by heat cycles.

DESCRIPTION OF EMBODIMENTS

[Primer Composition]

Figure 1:
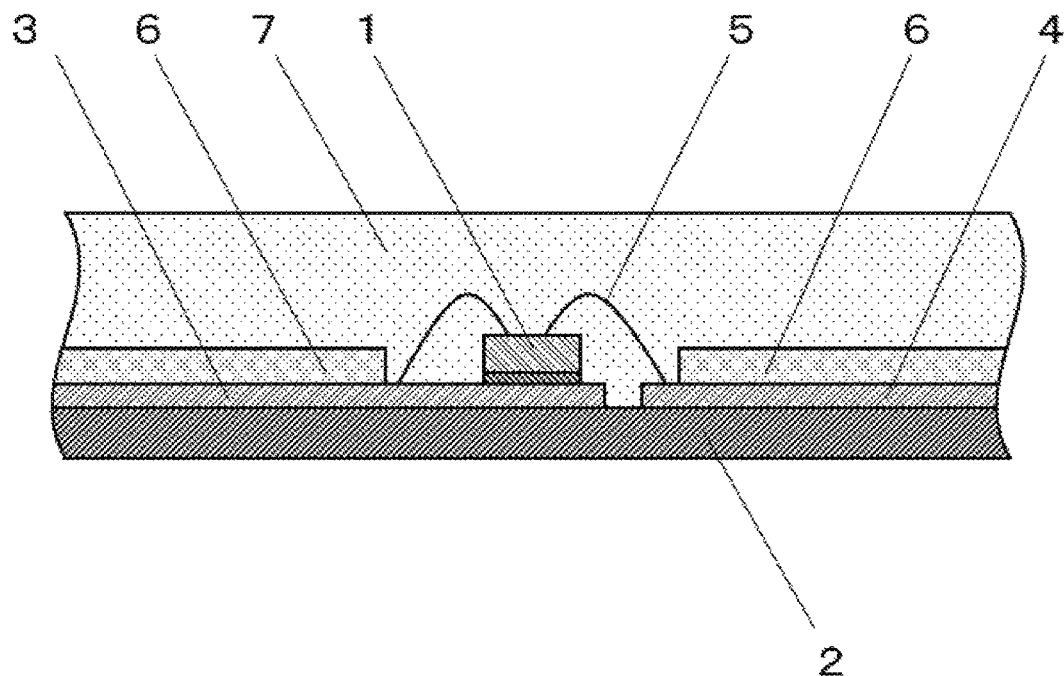
FIG. 1 is a cross sectional view of an optical semiconductor apparatus of a chip on board (COB) type, which is one example of an electric/electronic part of the present invention.

An organosiloxane block copolymer for component (A) is represented by the average unit formula:

$$(R^1{}_2SiO_{2/2})_a(R^2SiO_{3/2})_b.$$

In the formula, each $R^1$ and $R^2$ is independently an alkyl group having a carbon number of 1 to 12, an aryl group having a carbon number of 6 to 20, or an aralkyl group having a carbon number of 7 to 20. Specific examples thereof may include an alkyl group such as a methyl group, an ethyl group, a propyl group, an isopropyl group, a butyl group, an isobutyl group, a tert-butyl group, a pentyl group, a neopentyl group, a hexyl group, a cyclohexyl group, an octyl group, a nonyl group, and a decyl group; an aryl group such as a phenyl group, a tolyl group, a xylyl group, and a naphthyl group; and an aralkyl group such as a benzyl group, a phenethyl group, and a phenylpropyl group. $R^1$ is preferably an alkyl group and/or an aryl group, particularly preferably a methyl group and/or a phenyl group. $R^2$ is preferably an aryl group, particularly preferably a phenyl group.

In the formula, "a" is a number in the range of 0.40 to 0.90, preferably a number in the range of 0.50 to 0.90, or a number in the range of 0.60 to 0.90. In the formula, "b" is a number in the range of 0.10 to 0.60, preferably a number in the range of 0.10 to 0.50, or a number in the range of 0.10 to 0.40. Note that in the formula, "a+b+c"=1.00.

Further, in component (A), resinous siloxane blocks represented by the formula:

$$[R^2SiO_{3/2}]$$

are connected with linear siloxane blocks represented by the formula:

$$—(R^1{}_2SiO_{2/2})_n—.$$

In the resinous siloxane blocks represented by the formula:

$$[R^2SiO_{3/2}],$$

$R^2$ is an alkyl group having a carbon number of 1 to 12, an aryl group having a carbon number of 6 to 20, or an aralkyl group having a carbon number of 7 to 20, exemplified by the same groups as above. Moreover, the weight average molecular weight of this resinous siloxane block is not limited, and preferably at least 500. This means that this resinous siloxane block includes at least three or more trisiloxane units represented by the formula: $R^2SiO_{3/2}$. Note that this weight average molecular weight is derived from a resinous siloxane, which is a raw material, wherein the raw resinous siloxane can be measured via gel permeation chromatography (GPC).

Moreover, in the linear siloxane block represented by the formula:

$$—(R^1{}_2SiO_{2/2})_n—,$$

each $R^1$ is independently an alkyl group having a carbon number of 1 to 12, an aryl group having a carbon number of 6 to 20, or an aralkyl group having a carbon number of 7 to 20, exemplified by the same groups as above.

An organosiloxane block copolymer for component (A) comprises a disiloxy $[R^1{}_2SiO_{2/2}]$ unit and a trisiloxy $[R^2SiO_{3/2}]$ unit, further comprises 0.5 to 35.0 mol %, preferably 2 to 32 mol % of silicon atom-bonded hydroxyl groups [≡SiOH] or silicon atom-bonded alkoxy groups [≡SiOR]. Examples of this alkoxy group may include an alkoxy group having a carbon number of 1 to 4, such as an methoxy group, an ethoxy group, a propoxy group, an isopropoxy group, a butoxy group, an isobutoxy group, or a tert-butoxy group. This silicon atom-bonded hydroxyl group or silicon atom-bonded alkoxy group is present on any siloxy unit in the organosiloxane block copolymer, with this silicon atom-bonded hydroxyl group or silicon atom-bonded alkoxy group capable of being reacted to cure this composition.

Note that the mol fraction of the disiloxy $[R^1{}_2SiO_{2/2}]$ unit and the trisiloxy $[R^2SiO_{3/2}]$ unit in the organosiloxane block copolymer for component (A), as well as the content of the silicon atom-bonded hydroxyl group [≡SiOH] or the silicon atom-bonded alkoxy group [≡SiOR] in the organosiloxane block copolymer, can be measured by $^{29}$Si nuclear magnetic resonance spectrum (NMR).

Component (A) is a solid at 25° C., and has a softening point of 200° C. or lower. The preferable upper limit of the softening point is 150° C. or lower, or 100° C. or lower, while the preferable lower limit thereof is 30° C. or higher, or 50° C. or higher. Moreover, while the molecular weight of component (A) is not limited, the weight average molecular weight thereof is preferably 20,000 or higher, further preferably 40,000 or higher.

In the organosiloxane block copolymer for component (A), because the resinous siloxane blocks represented by the formula:

$$[R^2SiO_{3/2}]$$

are connected with the linear siloxane blocks represented by the formula:

$$—(R^1{}_2SiO_{2/2})_n—,$$

and the resinous siloxane blocks are further aggregated to form a "nanodomain" including a "hard" polymer block, this organosiloxane block copolymer is a solid at room temperature. In contrast, a phase separated linear siloxane block forms a "soft" polymer block, and this phase separated "soft" polymer block and a "hard" polymer block includes a "soft" polymer block having a different glass transition temperature ($T_g$), specifically, a lower $T_g$ such as lower than 25° C., lower than 0° C., or lower than −20° C., along with a "hard" polymer block having a higher $T_g$ such as higher than 30° C., higher than 40° C., or higher than 50° C. As a result, even when a silicone cured product, which is adhered to base materials of optical semiconductor elements, package materials, substrates, etc. via a primer layer formed by this composition, is subjected to heat cycles, etc., the primer layer can relax stress, and suppress peeling or cracking of the silicone cured product.

The preparation method of such an organosiloxane block copolymer for component (A) is not limited, with it prepared by methods described in, for example, Japanese Translation of PCT International Application Publication No. 2013-540169 and Japanese Translation of PCT International Application Publication No. 2013-544295.

Component (B) is a curing catalyst to promote curing of this composition, and preferably a condensation reaction catalyst. Examples of such a condensation reaction catalyst may include organic tin compounds such as dibutyltin dilaurate, dibutyltin diacetate, tin octenoate, dibutyltin dioctate, and tin laurate; organic titanium compounds such as tetrabutyl titanate, tetrapropyl titanate, and dibutoxybis(ethylacetoacetate); organic zirconium compounds such as tetrabutyl zirconate, tetrakis(acetylacetonato)zirconium, tetraisobutyl zirconate, butoxytris(acetylacetonato)zirconium, zirconium naphthenate, zirconium octylate, and zirconium 2-ethylhexanoate; organic aluminum compounds such as trimethoxyaluminum, triethoxyaluminum, triisopropoxyaluminum, tri-n-propylaluminum, aluminum naphthenate, aluminum stearate, aluminum octylate, aluminum benzoate, aluminumethylacetoacetatediisopropylate, aluminumethylacetoacetatediisobutyrate, aluminumtris(ethylacetoacetate), aluminumbisethylacetoacetatemonoacetylacetonate, and aluminumtris(acetylacetonate); nitrogen-containing compounds such as 1,8-diazabicyclo[5,4,0]-undeca-7-en (DBU), 1,5,7-triazabicyclo[4.4.0]deca-5-en (TBD), 1,4-diazabicyclo[2.2.0]octane (DABCO), 1,1,3,3-tetramethylguanidine (TMG), 1,5-diazabicyclo[4.3.0]-5-nonene (DBN), and 7-methyl-1,5,7-triazabicyclo[4.4.0]deca-5-en (MTBD); organic phosphorus compounds such as triphenyl phosphine oxide; acidic compounds such as hydrochloric acid, sulfuric acid, and dodecylbenzenesulfonic acid; and alkaline compounds such as ammonia and sodium hydroxide, with organic tin compounds, organic titanium compounds, nitrogen-containing compounds, and alkaline compounds preferable.

The content of component (B) is an amount to promote curing of this composition, and specifically, with respect to 100 parts by mass of component (A), preferably in the range of 0.005 to 0.5 parts by mass, or in the range of 0.01 to 0.5 parts by mass. This is because when the content of component (B) is the lower limit or more of the abovementioned range, the obtained composition can be sufficiently cured; in contrast, when it is the upper limit or less of the abovementioned range, the mechanical and optical properties of the primer layer obtained by curing the obtained composition are not impaired.

The organic solvent for component (C) is a component to dissolve component (A) in a solid state at 25° C. and improve the coating properties of this composition. Examples of such an organic solvent may include an aliphatic hydrocarbon based solvent such as n-heptane, n-hexane, isooctane, cyclopentane, and cyclohexane; an alcohol-based solvent such as ethanol, propanol, butanol, and cyclohexanol; an ether-based solvent such as diethylether, tetrahydrofuran, and 1,4-dioxane; a ketone-based solvent such as acetone and methylisobutyl ketone; an ester-based solvent such as ethyl acetate and butyl acetate; an aromatic hydrocarbon based solvent such as toluene and xylene; and an aromatic heterocycle-based solvent such as pyridine. Because component (A) can be sufficiently dissolved, component (C) preferably includes an aromatic hydrocarbon based solvent; moreover, because this composition can be uniformly applied to a base material, component (C) is preferably a mixed solvent of an aromatic hydrocarbon based solvent and an aliphatic hydrocarbon based solvent.

Taking the coating workability and drying workability of this composition into consideration, the content of component (C) is an amount that can be optionally determined, specifically an amount of 70% by mass or higher, preferably in the range of 70 to 99.9% by mass, or in the range of 80 to 99.9% by mass of this overall composition.

This composition may contain, as other optional components, alkenyl group-containing silane coupling agents such as vinyltrimethoxysilane, vinyltriethoxysilane, allyltrimethoxysilane, and allyltriethoxysilane; epoxy group-containing silane coupling agents such as 3-glycidoxypropyltrimethoxysilane and 2-(3,4-epoxycyclohexyl)ethyltrimethoxysilane; methacryl group- or acryl group-containing silane coupling agents such as 3-methacroxypropyltrimethoxysilane and 3-acryloxypropyltrimethoxysilane; amino group-containing silane coupling agents such as 3-aminopropyltrimethoxysilane, 3-aminopropyltriethoxysilane, and N-(2-ethylamino)-3-aminopropyltrimethoxysilane, etc. The content of the silane coupling agent is not limited, and preferably in the range of 0.05 to 5% by mass, or in the range of 0.1 to 2% by mass of this overall composition.

Moreover, for the case in which the curable silicone composition to adhere onto the primer layer of the present invention is hydrosilylation reaction curable, it may contain a catalyst for a hydrosilylation reaction in order to improve the curability and adhesion to this primer layer. Examples of a catalyst for such a hydrosilylation reaction may include a platinum-based catalyst, a rhodium-based catalyst, and a palladium-based catalyst, with a platinum-based catalyst preferable because curing of this composition can be significantly promoted. Examples of this platinum-based catalyst may include a platinum fine powder, platinum chloride, an alcohol solution of platinum chloride, a platinum-alkenylsiloxane complex, a platinum-olefin complex, and a platinum-carbonyl complex, with a platinum-alkenylsiloxane complex particularly preferable. Examples of this alkenylsiloxane may include 1,3-divinyl-1,1,3,3-tetramethyldisiloxane, 1,3,5,7-tetramethyl-1,3,5,7-tetravinylcyclotetrasiloxane, alkenylsiloxane obtained by substituting part of a methyl group of these alkenylsiloxanes for an ethyl group, a phenyl group, etc., and alkenylsiloxane obtained by substituting a vinyl group of these alkenylsiloxanes for an allyl group, a hexenyl group, etc. Because the stability of this platinum-alkenylsiloxane complex is particularly favorable, 1,3-divinyl-1,1,3,3-tetramethyldisiloxane is preferable. The content of the catalyst for a hydrosilylation reaction is, with respect to this overall composition, preferably an amount in which metal atoms are in the range of 0.01 to 10,000 ppm in mass units.

[Adhering Method]

Next, the adhering method of the present invention will be described in detail.

In the adhering method of the present invention, the abovementioned primer composition is first applied onto the base material.

The electric/electronic base material is not limited, with examples thereof potentially including an optical semiconductor element, a package material, and a substrate. Moreover, the material of the base material is not limited, with examples thereof potentially including a metal material such as aluminum, copper, nickel, and aluminum nitride; a metal oxide material such as glass and sapphire; an organic material such as an imide resin, a bismaleimide-triazine resin, a glass fiber-containing epoxy resin, a paper phenol resin, bakelite, a polyethyleneterephthalate resin, a polybutyleneterephthalate resin, a polyacrylonitrile resin, a polycarbonate resin, a fluorine resin, a polyimide resin, a polyphenylene sulfide resin, an aramid resin, a polyetherether resin, a polyetherimide resin, a liquid crystal polymer, a polyether sulfone resin, a cycloolefin resin, a silicone rubber, and a silicone resin.

The application amount of the primer composition is generally 30 to 100 g/m², preferably 10 to 50 g/m². This is because, when it is less than the abovementioned lower limit, a primer layer of sufficient thickness cannot be formed, with firm adhesion incapable of being achieved. This is also because, when it is more than the abovementioned upper limit, the primer layer becomes too thick, making it difficult to control the thickness of the curable silicone composition to be adhered.

As a method for applying the primer composition, conventionally known methods such as spraying, brush coating, and immersion are applicable. While the method for removing the organic solvent is not limited, well-known methods such as a method for drying by being left to stand at room temperature, a method for drying by blowing air, a method for forcibly evaporating the organic solvent by heating, and a method for drying by infrared-ray irradiation can be used. Note that the primer layer may be cured in the process of removing the organic solvent, or may be cured simultaneously upon subsequent curing of the curable silicone composition.

Next, a curable silicone composition is applied onto the primer layer of the base material for curing. This curable silicone composition is not limited, and is preferably a hydrosilylation reaction curable silicone composition. This hydrosilylation reaction curable silicone composition comprises, for example:

(I) organopolysiloxane having at least two alkenyl groups in a molecule;
(II) organopolysiloxane having at least two silicon atom-bonded hydrogen atoms in a molecule; and
(III) a catalyst for a hydrosilylation reaction.

Examples of alkenyl groups in component (I) may include a vinyl group, an allyl group, a butenyl group, a pentenyl group, and a hexenyl group. Moreover, examples of groups bonding to silicon atoms other than the alkenyl group in component (I) may include alkyl groups such as a methyl group, an ethyl group, a propyl group, a butyl group, a pentyl group, a hexyl group, and a heptyl group; cycloalkyl groups such as a cyclopentyl group and a cyclohexyl group; aryl groups such as a phenyl group, a tolyl group, a xylyl group, and a naphthyl group; aralkyl groups such as a benzyl group, a phenethyl group, and a 3-phenylpropyl group; and halogenated alkyl groups such as a chloromethyl group, a 3-chloropropyl group, a 3,3,3-trifluoropropyl group, and a nonafluorobutylethyl group.

The molecular structure of component (I) is not limited, with examples thereof potentially including a linear structure, a cyclic structure, a partially branched linear structure, and a branched structure. Moreover, the viscosity of component (I) is not limited, and preferably in the range of 20 to 100,000 mPa·s, or in the range of 100 to 10,000 mPa·s, at 25° C.

Examples of groups bonding to silicon atoms other than hydrogen atoms in component (II) may include alkyl groups such as a methyl group, an ethyl group, a propyl group, a butyl group, a pentyl group, a hexyl group, and a heptyl group; cycloalkyl groups such as a cyclopentyl group and a cyclohexyl group; aryl groups such as a phenyl group, a tolyl group, a xylyl group, and a naphthyl group; aralkyl groups such as a benzyl group, a phenethyl group, and a 3-phenylpropyl group; and halogenated alkyl groups such as a chloromethyl group, a 3-chloropropyl group, a 3,3,3-trifluoropropyl group, and a nonafluorobutylethyl group.

The molecular structure of component (II) is not limited, with examples thereof potentially including a linear structure, a cyclic structure, a partially branched linear structure, and a branched structure. Moreover, the viscosity of component (II) is not limited, and preferably in the range of 1 to 10,000 mPa·s at 25° C.

The content of component (II) may be a sufficient amount to cure the abovementioned curable silicone composition, and is, with respect to one mol of alkenyl groups in component (I), preferably an amount in which the silicon atom-bonded hydrogen atoms in component (II) are in the range of 0.3 to 10 mols.

Component (III) is a catalyst for a hydrosilylation reaction to promote curing of the abovementioned curable silicone composition, with the catalyst described above capable of being used.

The content of component (III) is not limited, and is an amount to promote curing of the abovementioned curable silicone composition, and is, with respect to the abovementioned curable silicone composition, preferably an amount in which the platinum metal is in the range of 1 to 1000 ppm, or an amount in the range of 5 to 100 ppm, in mass units.

Next, the curable silicone composition is cured on the primer layer. The conditions of curing the curable silicone composition are not limited, with the composition capable of being heated as required.

[Electric/Electronic Part]

Next, the electric/electronic part of the present invention will be described in detail.

The electric/electronic part of the present invention comprises an electric/electronic base material, a primer layer on the base material, and a silicone cured product on the primer layer, wherein the primer layer is formed by the abovementioned primer composition. Examples of this electric/electronic part may include an optical semiconductor apparatus (LED).

Figure 2:
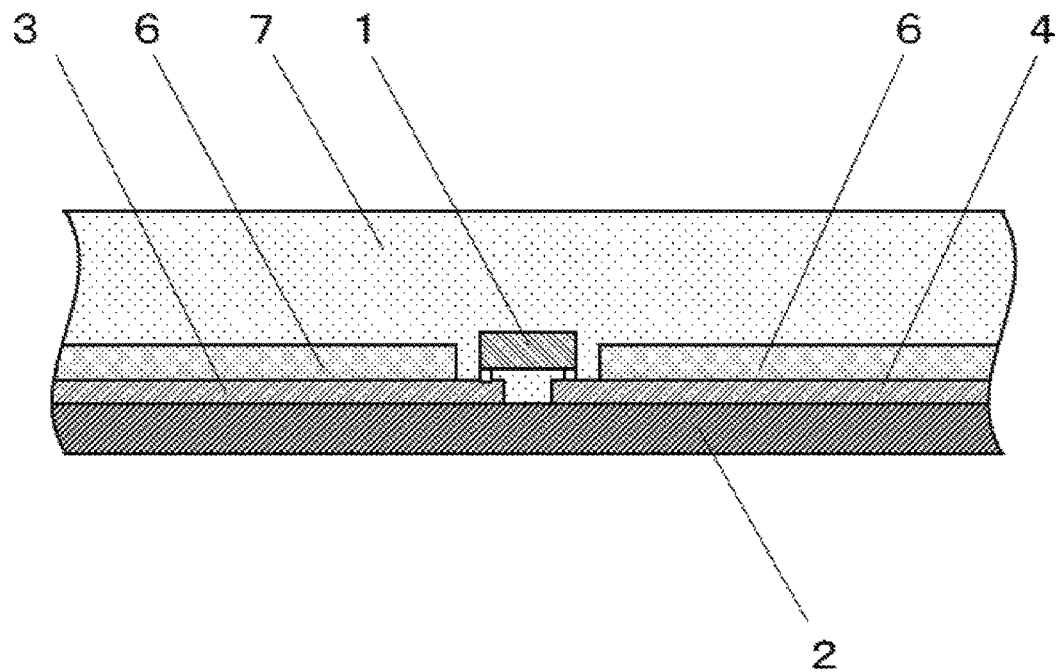
FIG. 2 is a cross sectional view of an optical semiconductor apparatus of a chip on board (COB) type, which is one example of another electric/electronic part of the present invention.

A cross sectional view of an optical semiconductor apparatus (LED), which is one example of the electric/electronic part of the present invention, is illustrated in FIGS. 1 and 2. FIG. 1 illustrates a cross sectional view of an optical semiconductor apparatus of a chip on board (COB) type, which is one example of an optical semiconductor apparatus of the present invention. In the optical semiconductor apparatus of a COB type of FIG. 1, optical semiconductor element 1 is mounted on substrate 2 for COB via a die bond, so as to electrically connect this optical semiconductor element 1 with circuits 3, 4 via bonding wire 5. Moreover, light reflecting material 6 is formed around the periphery of optical semiconductor element 1 on substrate 2, so as to efficiently well reflect light emitted from optical semiconductor element 1.

FIG. 2 illustrates a cross sectional view of another optical semiconductor apparatus of a chip on board (COB) type, which is one example of an optical semiconductor apparatus of the present invention. In the optical semiconductor apparatus of a COB type of FIG. 2, optical semiconductor element 1 is electrically connected with circuits 3, 4 on substrate 2 for COB via a bonding pad. Moreover, light reflecting material 6 is formed around the periphery of optical semiconductor element 1 on substrate 2, so as to efficiently well reflect light emitted from optical semiconductor element 1.

In the optical semiconductor apparatuses of FIGS. 1 and 2, substrate 2 may be a metal substrate of aluminum, copper, etc., with circuits 3, 4 formed on the surface of the metal substrate via an insulating layer (not shown). Moreover, for the case in which a nonmetal substrate is used as substrate 2, the insulating layer need not be formed. Examples of such a nonmetal substrate may include a glass epoxy substrate, a polybutyleneterephthalate (PBT) substrate, a polyimide substrate, a polyester substrate, an aluminum nitride substrate, a boron nitride substrate, a silicon nitride substrate, an alumina ceramics substrate, a glass substrate, and a flexible glass substrate. Further, as this substrate 2, a hybrid substrate including an aluminum substrate or copper substrate having an insulating resin layer, along with a printed wiring silicon substrate, silicon carbide substrate, or sapphire substrate, can be used.

As these circuits 3, 4, an alloy including at least one metal selected from the group consisting of silver, copper, and aluminum having high electric conductivity, or at least one selected from the group consisting of silver, copper, and aluminum is used. A primer layer (not shown) formed by the abovementioned primer composition is formed on the surface of circuits 3, 4. Further, in this substrate 2, light reflecting material 6 is formed on circuits 3, 4 via the primer layer so as to expose a portion for mounting optical semiconductor element 1.

In FIGS. 1 and 2, while optical semiconductor element 1 and light reflecting material 6 are sealed with sealing material 7, only optical semiconductor element 1 may be sealed with sealing material 7 in a dome shape. Note that in FIGS. 1 and 2, while only one optical semiconductor element 1 is illustrated on substrate 2, a plurality of these optical semiconductor elements 1 may be mounted on substrate 2.

EXAMPLES

The primer composition, the adhering method, and the electric/electronic part of the present invention will be described in detail with reference to examples. In the examples, the viscosity is the value at 25° C., with Me, Ph, and Vi representing a methyl group, a phenyl group, and a vinyl group, respectively, in the formulae. Moreover, the softening point of an organosiloxane block copolymer, along with the adhesion performance due to the primer composition, was evaluated as follows.

[Softening Point]

The organosiloxane block copolymer was molded into a cylindrical tablet shape of φ14 mm×22 mm, this tablet was then placed on a hot plate set to 25° C. to 100° C. and pressure from above under a load of 100 gram weight was maintained for 10 seconds, after which the load was removed, and subsequently, the deformation amount of the tablet was measured. The temperature at which the deformation amount in the height direction reached 1 mm or larger was defined as the softening point.

[Adhesion Force of Curable Silicone Compositions]

A curable silicone composition was applied onto five portions of a glass substrate of 25 mm×75 mm using a dispenser in an amount of approximately 100 mg. Next, this composition was covered with a 6 mm square aluminum chip having a thickness of 1 mm, pressure-bonded with a plate of 1 kg, heated and cured at 150° C. for 2 hours in this state, and subsequently cooled to room temperature to manufacture a die shear test piece. The die shear strength of this test piece was measured using a die shear strength measuring apparatus (Bond Tester SS-100KP produced by Seishin Trading Co., Ltd.) to obtain the average value thereof.

Reference Example 1—Preparation of the Organosiloxane Block Copolymer 45.0 g of an organopolysiloxane resin represented by the average unit formula: $PhSiO_{3/2}$ and having a weight average molecular weight of 1,300, along with 70.38 g of toluene, was placed in a 500 mL four-neck round-bottom flask equipped with a Dean Stark apparatus with a thermometer, a stirring paddle made of Teflon (registered trademark), and a water cooled condenser installed therein, and heated while stirring under a nitrogen atmosphere. The reaction mixture was heated for 30 minutes while being toluene refluxed, and subsequently cooled to 108° C.

Moreover, 1.21 g of a mixture having a mass ratio of 1:1 of methyltriacetoxysilane to ethyltriacetoxysilane was added to a solution including 55.0 g of methylphenylpolysiloxane (polymerization degree: 140) having both terminals of the molecular chain blocked with silanol groups and 29.62 g of toluene, to prepare a toluene solution of methylphenylpolysiloxane (polymerization degree: 140) having both terminals of the molecular chain blocked with diacetoxy groups.

The abovementioned toluene solution of the methylphenylpolysiloxane having both terminals of the molecular chain blocked with diacetoxy groups was rapidly added to the abovementioned reaction mixture under a nitrogen atmosphere, and reacted at room temperature for two hours. Subsequently, the reaction mixture was heated for two hours while being toluene refluxed. Next, this was cooled to 108° C., and 7.99 g of the mixture having a mass ratio of 1:1 of methyltriacetoxysilane to ethyltriacetoxysilane was added. The reaction mixture was further heated for one hour while being toluene refluxed. Next, this was cooled to 90° C., after which 12 mL of ion exchange water was added. The temperature was increased and refluxed, and water was removed via azeotropic distillation. The reaction mixture was again cooled to 90° C., and a further 12 mL of ion exchange water was added. This was heated and refluxed to remove water again. Subsequently, 56.9 g of toluene was removed via distillation to increase the solid content. The obtained reaction product was cooled to room temperature, subsequently pressurized and filtered with a 5.0 μm filter, and toluene used to obtain a toluene solution of a reaction product having a solid concentration of 10% by mass. It was found by $^{29}Si$ nuclear magnetic resonance spectrum analysis that this reaction product is an organosiloxane block copolymer is represented by the average unit formula:

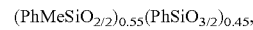

$(PhMeSiO_{2/2})_{0.55}(PhSiO_{3/2})_{0.45}$, in which the phenylsiloxane resin blocks represented by the formula:

$(PhSiO_{3/2})$ are connected with the methylphenylsiloxane blocks represented by the formula:

$—(PhMeSiO_{2/2})_{140}—$, and has 16 mol % of silicon atom-bonded hydroxyl groups and a softening point of 55° C.

Reference Example 2—Preparation of the Primer Composition 10 parts by mass of allyltrimethoxysilane was added to 100 parts by mass of n-heptane and mixed, subsequently 2 parts by mass of tetra(n-butyl)titanate was added and uniformly mixed, then 0.1 parts by mass of a complex of platinum chloride and 1,3-divinyltetramethyldisiloxane was added and uniformly mixed to prepare a primer composition.

Reference Example 3—Preparation of the Curable Silicone Composition 4.4 parts by mass of methylvinylpolysiloxane having a linear methylvinylsiloxane block represented by the formula:

-(MeViSiO)$_{20}$— with both terminals of the molecular chain blocked with hydroxyl groups, 4.1 parts by mass of dimethylpolysiloxane having both terminals of the molecular chain blocked with dimethylvinylsiloxy groups and represented by the formula:

Me$_2$ViSiO(Me$_2$SiO)$_{160}$SiMe$_2$Vi, 51.8 parts by mass of titanium oxide (SX-3103 produced by Sakai Chemical Industry Co., Ltd.) having an average primary particle diameter of 0.2 μm, 30 parts by mass of spherical silica (HS-202 produced by Nippon Steel Materials Co., Ltd. Micron Co.) having an average particle diameter of 15 μm, and 4 parts by mass of dimethylpolysiloxane having a viscosity of 24 mPa·s, with one terminal of the molecular chain blocked with a dimethylvinylsiloxy group and another terminal of the molecular chain blocked with a trimethoxysiloxy group, and represented by the formula:

Me$_2$ViSiO(Me$_2$SiO)$_{29}$Si(OMe)$_3$, were placed in a Ross mixer, mixed at room temperature, and kneaded under reduced pressure while heated to 150° C., to prepare a silicone base.

Next, 4.7 parts by mass (an amount of 1.5 mols of silicon atom-bonded hydrogen atoms in this component, with respect to the total of one mol of vinyl groups in methylvinylpolysiloxane and in dimethylpolysiloxane having both terminals of the molecular chain blocked with dimethylvinylsiloxy groups in the silicone base) of methylhydrogenpolysiloxane having a linear methylhydrogensiloxane block represented by the formula:

-(MeHSiO)$_{50}$— and having both terminals of the molecular chain blocked with trimethylsiloxy groups, 1 parts by mass of a condensation reaction product having a mass ratio of 1:2 of dimethylsiloxane-methylvinylsiloxane copolymerized oligomer having both terminals of the molecular chain blocked with hydroxyl groups and having a viscosity of 20 mPa·s to 3-glycidoxypropyltrimethoxysilane, and 1-ethinyl-1-cyclohexanol (an amount of 200 ppm in mass units with respect to this composition) were mixed into this silicone base at room temperature, after which a 1,3-divinyl-1,1,3,3-tetramethyldisiloxane solution of 1,3-divinyl-1,1,3,3-tetramethyldisiloxane of platinum (an amount of 3.5 ppm of platinum atoms in mass units with respect to this composition) was mixed to prepare a curable silicone composition.

Practical Example 1

5 g of a toluene solution (solid concentration: 10% by mass) of the organosiloxane block copolymer prepared in Reference Example 1, 0.0005 g of 1,8-diazabicyclo[5,4,0]-undeca-7-en (DBU), and 5 g of toluene were uniformly mixed to prepare a primer composition. Next, this primer composition was uniformly applied onto a glass plate in an application amount of 50 g/m$^2$, and dried at 100° C. for 30 minutes. The primer layer on the glass plate was slightly spotted and not uniform, but had no surface tackiness. Next, the curable silicone composition prepared in Reference Example 3 was applied on the side of the primer layer of the glass plate to manufacture a die shear test piece. The die shear strength was measured, with the results thereof shown in Table 1.

Practical Example 2

2.5 g of a toluene solution (solid concentration: 10% by mass) of the organosiloxane block copolymer prepared in Reference Example 1, 0.00025 g of 1,8-diazabicyclo[5,4,0]-undeca-7-en (DBU), and 7.5 g of toluene were uniformly mixed to prepare a primer composition. Next, this primer composition was uniformly applied onto a glass plate in an application amount of 50 g/m$^2$, and dried at 100° C. for 30 minutes. The primer layer on the glass plate was slightly spotted and not uniform, but had no surface tackiness. Next, the curable silicone composition prepared in Reference Example 3 was applied on the side of the primer layer of the glass plate to manufacture a die shear test piece. The die shear strength was measured, with the results thereof shown in Table 1.

Practical Example 3

1.0 g of a toluene solution (solid concentration: 10% by mass) of the organosiloxane block copolymer prepared in Reference Example 1, 0.0001 g of 1,8-diazabicyclo[5,4,0]-undeca-7-en (DBU), and 9 g of toluene were uniformly mixed to prepare a primer composition. Next, this primer composition was uniformly applied onto a glass plate in an application amount of 50 g/m$^2$, and dried at 100° C. for 30 minutes. The primer layer on the glass plate was uniform, and had no surface tackiness. Next, the curable silicone composition prepared in Reference Example 3 was applied onto the side of the primer layer of the glass plate to manufacture a die shear test piece. The die shear strength was measured, with the results thereof shown in Table 1.

Practical Example 4

2.5 g of a toluene solution (solid concentration: 10% by mass) of the organosiloxane block copolymer prepared in Reference Example 1, 0.00025 g of 1,8-diazabicyclo[5,4,0]-undeca-7-en (DBU), 2.5 g of toluene, and 5.0 g of n-heptane were uniformly mixed to prepare a primer composition. Next, this primer composition was uniformly applied on to a glass plate in an application amount of 50 g/m$^2$, and dried at 100° C. for 30 minutes. The primer layer on the glass plate was uniform, and had no surface tackiness. Next, the curable silicone composition prepared in Reference Example 3 was applied onto the side of the primer layer of the glass plate to manufacture a die shear test piece. The die shear strength was measured, with the results thereof shown in Table 1.

Comparative Example 1

The curable silicone composition prepared in Reference Example 3 was applied to a glass plate not subjected to primer treatment, to manufacture a die shear test piece. The die shear strength was measured, with the results thereof shown in Table 1.

Comparative Example 2

The primer composition prepared in Reference Example 2 was uniformly applied onto the glass plate in an application amount of 50 g/m², and dried at 100° C. for 30 minutes. The primer layer on the glass plate was uniform. Next, the curable silicone composition prepared in Reference Example 3 was applied onto the side of the primer layer of the glass plate to manufacture a die shear test piece. The die shear strength was measured, with the results thereof shown in Table 1.

TABLE 1

| | Prac. Example 1 | Prac. Example 2 | Prac. Example 3 | Prac. Example 4 | Comp. Example 1 | Comp. Example 2 |
|---|---|---|---|---|---|---|
| Die shear strength (MPa) | 3.4 | 2.9 | 1.4 | 3.1 | 0.1 | 0.3 |

INDUSTRIAL APPLICABILITY

Because the primer composition of the present invention improves the adhesion of silicone cured products to base materials of optical semiconductor elements, package materials, substrates, etc., and can suppress peeling or cracking of the silicone cured products caused by heat cycles, the primer composition is suitable as a primer composition when manufacturing large LED devices having a high calorific value, such as LEDs having high luminance/high output.

REFERENCE NUMERALS 1 optical semiconductor element
2 substrate
3 circuit
4 circuit
5 bonding wire
6 light reflecting material
7 cured product of a curable silicone composition

The invention claimed is:

1. An article comprising a base material, a silicone cured product, and a primer layer adhering the silicone cured product to the base material,
   wherein the primer layer comprises the reaction product of a primer composition comprising:
   (A) an organosiloxane block copolymer represented by the average unit formula:

$(R^1_2SiO_{2/2})_a(R^2SiO_{3/2})_b$ wherein each $R^1$ and $R^2$ is independently an alkyl group having 1 to 12 carbon atoms, an aryl group having 6 to 20 carbon atoms, or an aralkyl group having 7 to 20 carbon atoms, "a" is a number in the range of 0.40 to 0.90, "b" is a number in the range of 0.10 to 0.60, and "a+b"=1.00, having 0.5 to 35.0 mol % of silicon atom-bonded hydroxyl groups or silicon atom-bonded alkoxy groups, in addition to being a solid at 25° C. and having a softening point of 200° C. or lower, in which resinous siloxane blocks represented by the formula:

$[R^2SiO_{3/2}]$ wherein $R^2$ is the same as above, are connected by linear siloxane blocks represented by the formula:

$-(R^1_2SiO_{2/2})_n-$ wherein $R^1$ is the same as above, and "n" is a number in the range of 10 to 400;
   (B) a curing catalyst, in an amount to promote curing of this composition; and
   (C) an organic solvent; and
   wherein the silicone cured product comprises the reaction product of a curable silicone composition different from the primer composition.

2. The article according to claim 1, wherein $R^1$ in component (A) is an alkyl group and/or an aryl group.

3. The article according to claim 1, wherein $R^2$ in component (A) is an aryl group.

4. The article according to claim 1, wherein component (B) is a condensation reaction catalyst.

5. The article according to claim 1, wherein component (C) is an aromatic hydrocarbon based solvent, or a mixed solvent of the aromatic hydrocarbon based solvent and an aliphatic hydrocarbon based solvent.

6. The article according to claim 4, wherein the primer composition is a condensation reaction curable silicone composition.

7. The article according to claim 6, wherein the curable silicone composition is a hydrosilylation reaction curable silicone composition.

8. The article according to claim 1, wherein the base material is an electric/electronic part.

9. A method of forming the article according to claim 1, with the article comprising the base material, the silicone cured product, and the primer layer adhering the silicone cured product to the base material, the method comprising:
   applying the primer composition onto the base material;
   removing the organic solvent (C) to obtain the primer layer; and
   subsequently applying the curable silicone composition onto the primer layer for curing to form the silicone cured product.

10. The method according to claim 9, wherein the curable silicone composition and the primer layer are simultaneously cured.

11. The article according to claim 8, wherein the electric/electronic part is an optical semiconductor apparatus.

12. The article according to claim 2, wherein $R^2$ in component (A) is an aryl group.

* * * * *